United States Patent [19]

Mautref et al.

[11] Patent Number: 4,577,588

[45] Date of Patent: Mar. 25, 1986

[54] DEVICE FOR PROCESS-TYPE DEPOSITION OF POLYCRYSTALLINE SILICON ON CARBON FILM

[75] Inventors: Michel Mautref, Ozoir la Ferriere; Christian Belouet, Sceaux, both of France

[73] Assignees: Compagnie Generale d'Electricite; Societe Nationale Elf Aquitaine, both of France

[21] Appl. No.: 644,910

[22] Filed: Aug. 28, 1984

[30] Foreign Application Priority Data

Aug. 29, 1983 [FR] France ............................ 83 13834
Dec. 1, 1983 [FR] France ............................ 83 19212

[51] Int. Cl.⁴ ............................................. B05C 3/132
[52] U.S. Cl. .................................... 118/665; 118/667; 118/694; 118/405
[58] Field of Search .............. 118/665, 694, 405, 404, 118/419, 667; 427/74

[56] References Cited

U.S. PATENT DOCUMENTS

| | | | |
|---|---|---|---|
| 3,730,962 | 5/1973 | Norwalk | 13/31 |
| 3,740,563 | 6/1973 | Reichard | 250/222 |
| 4,246,868 | 1/1981 | Brown et al. | 118/694 |
| 4,383,130 | 5/1983 | Uroshevich | 427/74 X |

FOREIGN PATENT DOCUMENTS 2386359  3/1978  France ............................ 118/405

*Primary Examiner*—John P. McIntosh
*Attorney, Agent, or Firm*—Sughrue, Mion, Zinn, Macpeak, and Seas

[57] ABSTRACT

A crucible containing molten silicon, has a strip of carbon film vertically transported through the melt, an optical system imaging a small area of the silicon surface onto a photodetector, said image area being that of the silicon liquid-solid interface, and a servo system connected to said photodetector and to an electrical drive for feeding silicon into said melt. The invention is applicable to the manufacture of solar cells.

7 Claims, 5 Drawing Figures

DEVICE FOR PROCESS-TYPE DEPOSITION OF POLYCRYSTALLINE SILICON ON CARBON FILM

FIELD OF THE INVENTION

This invention concerns a device for depositing on a continuous-flow or process-type basis a layer of polycristalline silicon on a carbon film, said device being of a type comprising a crucible, an electrical system for feeding silicon to the crucible, crucible heating means enabling the formation of a molten silicon bath in the crucible, and means for upwardling transporting at a constant speed the carbon film passing vertically through the equilibrium surface of the bath in order to deposit said layer.

BACKGROUND OF THE INVENTION

A device of this type is known as per document FR-A-2,386,359.

The silicon-coated carbon films obtained with this device can be used to make solar cells. It is important, from the users' point of view, to obtain a constant depth of deposited silicon on the film. However, as has been shown, the coating thickness for any given pulling speed of the film depends on the temperature of the molten silicon or melt, said temperature changing rapidly with the level of the equlibrium surface of the melt. It is thus necessary, in order to have a constant thickness of deposited silicon, to stabilize the level of the melt.

This invention is directed to stabilizing over time the level of the molten silicon bath in devices of the above-mentioned type. It is also directed to enabling the setting at a predetermined, constant value of the thickness or depth of the silicon layer deposited by means of such a device.

SUMMARY OF THE INVENTION

Accordingly, the invention provides a device for continuous-flow or process-type deposition of a layer of polycrystalline silicon on a carbon film, said device being of the type specified hereinabove and further comprising:

an optical system centered on a fixed axis in relation to the crucible, said system being arranged to form an image of one area of the silicon surface, said area extending from just above to just below the liquid-silicon to solid-deposited-silicon interface line;

a photodetector arranged to receive said image and operable to responsively deliver an electric measurement signal corresponding to the liquid level in the crucible;

and a servo system connected to the electrical output of the photodetector and operable to compare the measuring signal with a reference signal standing for a preset level of the molten bath to yield an error signal, said servo system being connected to the electrical drive for the crucible's silicon feed system so as to control crucible feed to reduce said error signal.

In one embodiment of the device according to the invention, said device further comprises:

means of measuring the thickness of the silicon coat deposited onto the carbon film, and a second servo system connected to the measuring means, operable to determine the difference between the measured thickness and a preset reference thickness, said second servo system being connected to said initially-mentioned crucible heating means in order to adjust heating to reduce said last-mentioned difference.

In an alternative embodiment of the device according to the invention, said photodetector includes:

two photocells, the photosensitive surfaces thereof being coplanar and juxtaposed on either side of a dividing line, said detector being arranged so that the dividing line cuts the image of said liquid-solid interface at other than a 90° angle, and a processing system connected to the output of the cells, said processing system consisting of means for summing and subtracting the output signals from the two cells and means for dividing the sum signal by the difference signal so obtained said latter means being able to deliver said electric measuring signal, said measuring signal being unaffected by the time-dependent changes in the luminous power emitted by said image area.

BRIEF DESCRIPTION OF THE DRAWINGS

Different embodiments of the device according to the invention shall now be described in greater detail, as non-limiting examples, with reference to the appended drawings in which.

DESCRIPTION OF THE PREFERRED EMBODIMENTS

Figure 1:
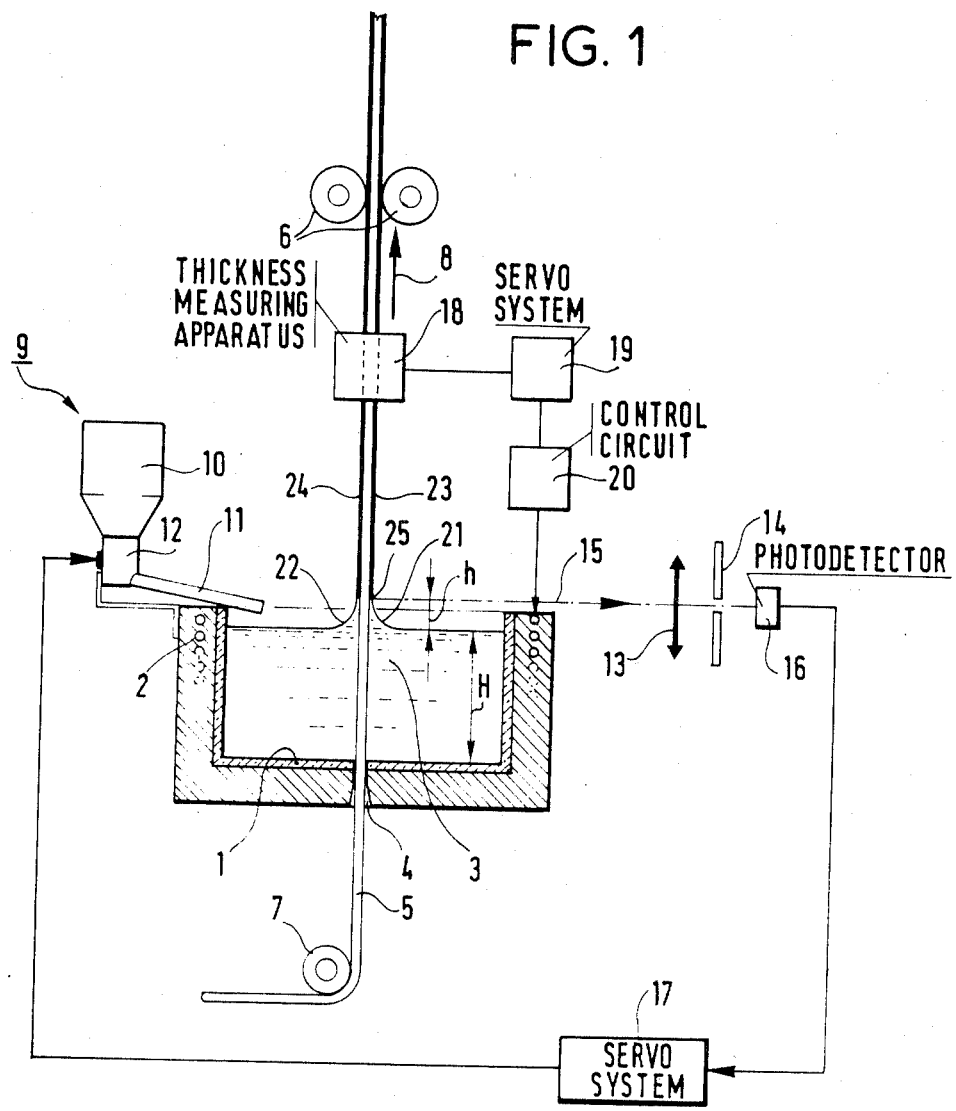
FIG. 1 is a diagram of one embodiment of the invention.

FIG. 1 shows a silica crucible 1 the outside walls whereof are surrounded by an induction furnace or other suitable heating means 2. The crucible 1 contains a bath or silicon melt 3 whose equilibrium surface within the crucible reaches a level H. The bottom of said crucible 1 is provided with a gauged slit 4 through which passes vertically a carbon film 5 being pulled up vertically through the equilibrium surface of the melt 3. Mechanical means (6,7) are provided to transport the film 5 upwardly in the direction of arrow 8.

Electromechanical means 9 are provided at the edge of the crucible 1 to feed solid silicon thereinto. Said means 9 essentially consist of a hopper 10 of sized silicon pellets, an outlet duct 11 sloping to the inside of the crucible and an electromechanical dispenser 12 mechanically linking the hopper 10 with the outlet duct 11.

An optical system, schematically represented by a simple focusing lens 13 associated with a diaphragm 14, is centered on an axis 15 fixed in relation to the crucible and located slightly above the level of the melt 3. The electrical output of a photodetector 16 arranged on the axis 15 is connected via a servo system 17 to the electrical drive of the dispenser 12. This detector 16 may, for example, be a solar cell.

A thickness measuring apparatus 18 surrounds the carbon film 5 on leaving the melt 3. This apparatus 18 is connected, via a second servo system 19 and a control circit 20, to the electrical input of the furnace 2.

The device depicted in FIG. 1 operates as follows:

The film 5 transport means 6, 7 pull the film through the melt at a constant speed. In the process, the equilibrium level of the melt rises along the two faces of the film to form two menisci 21 and 22, whilst two coats 23 and 24 of polycristalline silicon deposit onto the faces of film 5 as it leaves the melt 3. A liquid-solid interface line 25, seen as a point in FIG. 1, is established between the molten silicon of the melt 3 and the solid silicon of the coating layer 23. This interface line occurs at the upper limit of meniscus 21, at a height h above the level of the melt. Such level elevation h results from capillary attraction and is practically independent of the level, as well as the temperature of the melt, or enough so to be considered constant.

Deposition of polycristalline silicon layers on the carbon film, by bringing about a loss of matter from the melt, tends to lower the level of the melt. To compensate such loss of matter, the feed system 9 feeds silicon pellets one at a time into the melt through outlet 11, at a rate controlled by the electrical signal supplied by servo system 17 to the electromechanical dispenser 12.

The optical system 13, 14 is mounted near the crucible 1 such that its axis 15 cuts the interface line 25 when the melt is at a level H at which it may desirably be stabilized. Lens 13 images onto the sensitive surface of detector 16 a small area of the silicon surface extending from just above to just below the liquid-solid interface line 25, specifically that area defined by the diaphragm 14. The axis 15 of the optical system may be either horizontal, as depicted in FIG. 1, or slightly offset from horizontal to prevent masking by the crucible edge of the small-area image on the detector 16. The part of said image corresponding to the liquid silicon is much darker than that corresponding to the solid silicon, since liquid silicon is far less luminous than solid silicon near its melting point. The photodetector 16 delivers a signal the amplitude whereof is directly related to the illumination received. This signal thus varies as the dividing line between the two parts of the image moves about the sensitive surface of the detector.

Accordingly, given that h has a constant value, any change in the melt level brings about an equal and same-directional change in the level of the interface line 25 which in turn causes a matching change in the electrical output of photodetector 16. The servo system 17 compares said electrical output to a reference signal to constitute an error signal. System 17 also controls the feed-rate of silicon pellets in view of reducing the error signal. The device depicted in FIG. 1 therefore makes it possible to stabilize the melt level at a preset value.

The depth or thickness of the coat of polycristalline silicon deposited onto the film 5 varies with the temperature of the melt, approximately by a few micrometers per degree centigrade. Moreover, the melt temperature itself varies as a function of melt depth or level, approximately by 3 degrees C per millimeter level change. The above-described device further enables melt-level-induced melt temperature variations to be avoided. By varying the melt temperature through control of the heat supplied by the furnace 2, it is possible to adjust the thickness of the silicon layer being deposited onto the carbon film.

This adjustment can be made by means of the measuring apparatus 18, which can consist for example of an X-ray or gamma ray probe, or a capacitative probe, supplying an electric measuring signal representing the thickness of the deposited layer of silicon. The second servo system 19 compares this signal to a reference signal and controls, via circuit 20, the power provided by furnace 2 in order to lessen the difference between the measuring or process signal and the reference signal. Said servo system can include means for changing the reference signal in view of a corresponding change in the thickness of deposited silicon.

Figure 2:
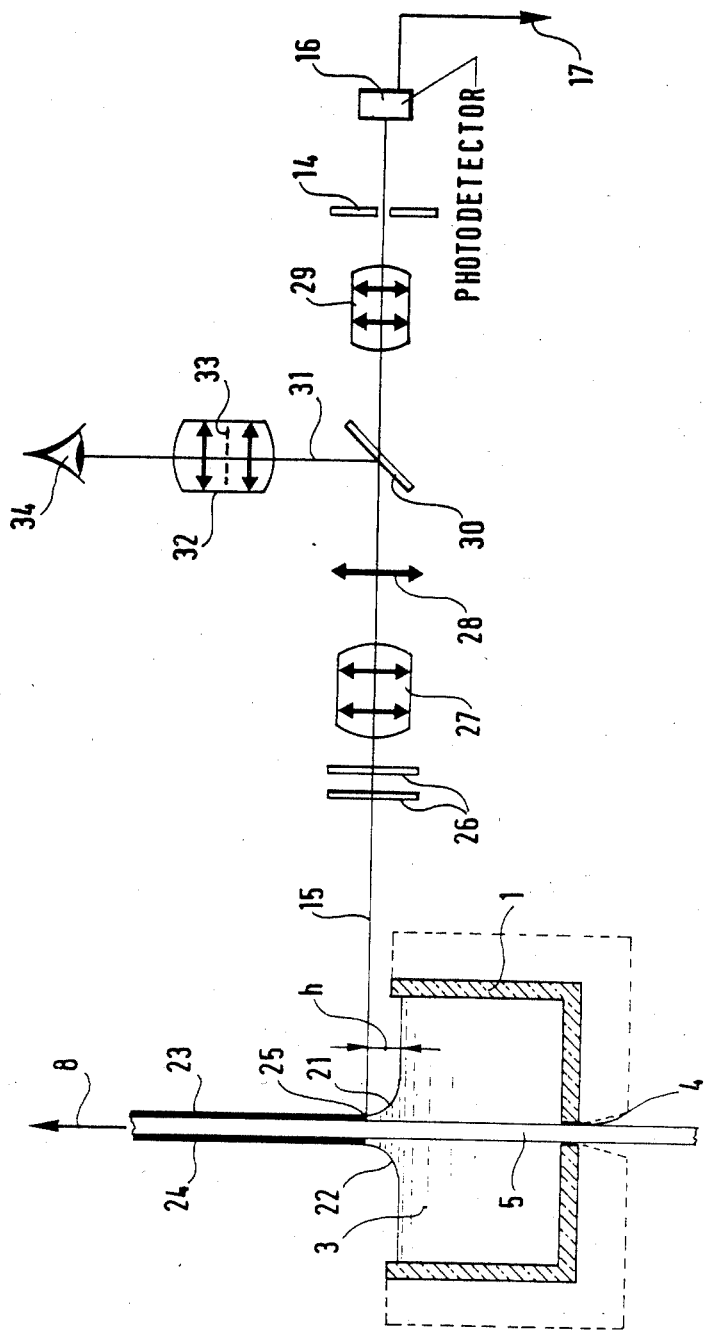
FIG. 2 is a more detailed diagram of a preferred embodiment of a melt level tracking system for a device of the type depicted in FIG. 1.

The elements of an optical system as mentioned above for sighting the liquid-solid interface line 25 are diagrammed in FIG. 2. The system shown comprises, in the order of their alignment along axis 15 from line 25 to photodetector 16, filters 26, a lens 27, an optical relay 28, an eyepiece 29 and the diaphragm 14.

Between the optical system 28 and the eyepiece 29 is provided an optical plate 30 which is partially reflecting the tilted 45° with respect to axis 15 to reflect along an axis 31 part of the light coming from the target area on line 25. A second eyepiece 32 including a reticle 33 is centered on axis 31 to allow an operator's eye 34 to observe the target area.

In the device depicted in FIG. 1, the electrical output of the photodetector 16 is directly coupled to the input of the servo system. The electrical output signal from the detector is proportional to the light energy from the target area impinging on detector's photosensitive surface. This energy is representative of the silicon melt level in the crucible.

However, it appears that the luminous power of the target area can change over time, regardless of the melt level, for a variety of reasons, and especially when the temperature of the silicon located in said target area itself changes. Such changes in luminous power interfere with silicon melt level control.

Figure 3:
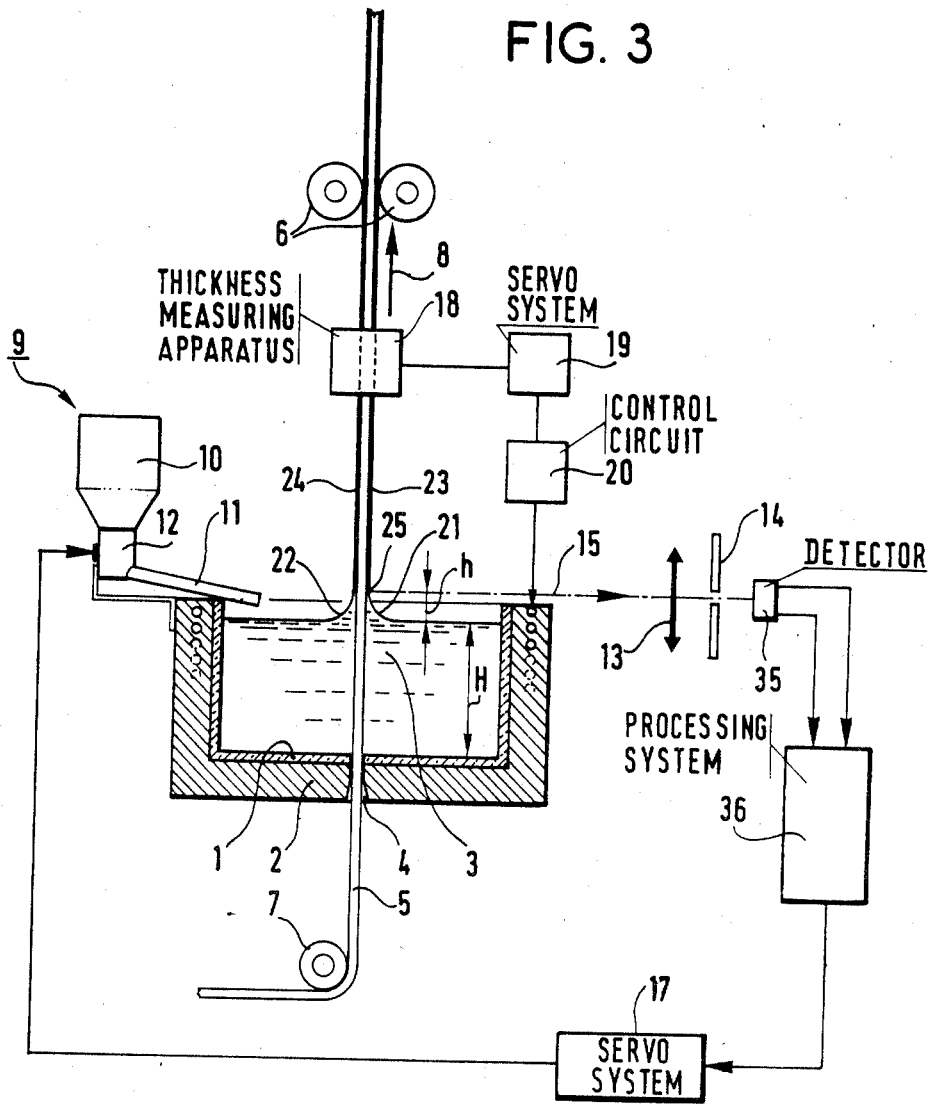
FIG. 3 is a diagram of a second embodiment of the invention.

The device illustrated in FIG. 3 is designed to prevent such luminous-power-induced interferences with melt level control. The figure shows a silica crucible 1 the outside walls of which are surrounded by a furnace 2, such as an induction furnace for example. Said crucible 1 contains a bath or silicon melt 3 whose equilibrium surface within the crucible reaches a level H. The bottom of said crucible 1 is provided with a gauged slit 4 through which passes vertically a carbon film 5 being pulled up vertically through the equilibrium surface of the melt 3. Rollers 6 and 7 transport the film 5 upwardly in the direction of arrow 8.

Electromechanical means are provided at the edge of the crucible 1 to feed solid silicon thereto. Said means 9 essentially consist of a hopper 10 of sized silicon pellets, an outlet duct 11 sloping to the inside of the crucible and an electromechanical dispenser 12 mechanically linking the hopper 10 with the duct 11.

An optical system 13, schematically represented by a single lens associated with a diaphragm 14, is centered on an axis 15, fixed in relation to the crucible, and located slightly above the level of the melt 3. Along said axis 15 is arranged a photodetector consisting of an assembly of two photocells 35 and a signal processing system 36 the input whereto is connected to the electrical outputs of the two cells. The processing system's output is connected, via a servo system 17, to the electrical drive of the dispenser 12.

A thickness measuring apparatus 18 surrounds the film 5 where it leaves the melt 3. Measuring apparatus 18 is connected, via a second servo system 19 and a control system 20, to the electrical input of the furnace 2.

Figure 4:
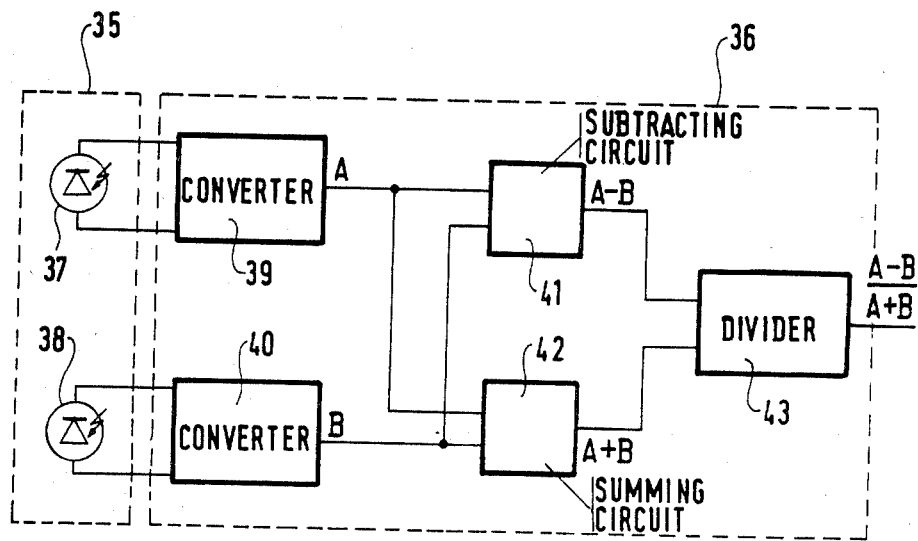
FIG. 4 is a more detailed diagram of the photodetector used in the device depicted in FIG. 3.

FIG. 4 is a diagram of the photodetector constituted by the assembly 35 of two photocells and the processing system 36 connected thereto. Said photoelectric cells are designated by the numbers 37 and 38. The electrical outputs of cell 37 drive a current-to-voltage converter 39 and those of cell 38 drive a second converter 40, similar to converter 39, both of said converters being part of the processing system 36. The outputs of converters 39 and 40 are connected on the one hand respectively to the two inputs of a subtracting circuit 41 and on the other hand to the two inputs of a summing circuit 42. The subtractor and summing circuit outputs are respectively connected to the two inputs of a divider circuit 43 the output thereof being the output of the processing system.

Figure 5:
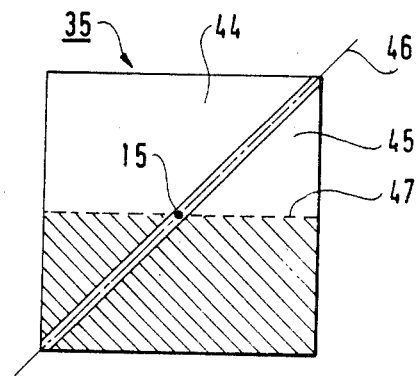
FIG. 5 shows the photosensitive surfaces of two photocells being part of the photodetector depicted in FIG. 4.

FIG. 5 shows the photosensitive surfaces 44 and 45 of the two photocells 37 and 38 making up assembly 35. Surfaces 44 and 45 are shaped as rectangular isosceles triangles and are arranged opposite one another in the same plane, separated by a dividing line 46 parallel to the base of both triangles and very close to said bases. Such a two-cell assembly can be obtained by photoetching a narrow channel into the junction area of a square solar cell so that said channel conicides with the diagonal of the square.

The device illustrated in FIGS. 3, 4 and 5 operates as follows:

The carbon film 5 transport means 6, 7 pull the film through the melt at a constant speed. In the process, the equilibrium level of the melt rises along the two faces of the film to form two menisci 21 and 22, whilst two coats 23 and 24 of polycrystalline silicon deposit onto the faces of film 5 as it leaves the melt 3. A liquid-solid interface line 25, seen as a point in FIG. 1, is established between the molten silicon of the melt 3 and the solid silicon of the coating layer 23. This interface line occurs at the upper limit of meniscus 21, at a height h above the level of the melt. Such level elevation h results from capillary attraction and is practically independent of the level, as well as the temperature, of the melt, or enough so to be considered constant. Accordingly, the height of the liquid-solid interface 25 is directly related to the level H of the melt.

Deposition of polycrystalline silicon layers on the carbon film, by bringing about a loss of matter from the melt, tends to lower the level of the melt. To compensate such loss of matter, the feed system 9 feeds silicon pellets one at a time into the melt through outlet 11, at a rate controlled by the electrical signal supplied by servo system 17 to the electromechanical dispenser 12.

The optical system 13, 14 is mounted near the crucible 1 such that its axis 15 cuts the interface line 25 when the melt is at a level H at which it may desirably be stabilized. Lens 13 images onto the sensitive surface of photocell assembly 35 a small area of the silicon surface extending from just above to just below the liquid-solid interface line 25, specifically that area defined by the diaphragm 14. The axis 15 of the optical system may be either horizontal, as depicted in FIG. 3, or slightly offset from horizontal to prevent masking by the crucible edge of the target area image.

The photosensitive surfaces 44 and 45 lie in a plane perpendicular to the plane of FIG. 3 and the center of the square making up the receiving surface of cell assembly 35 is on axis 15. Said square is rotated so that the image of the interface line 25 thereon intersects the dividing line 46 at other than a 90° angle and preferably at an angle of 45°, said latter angle affording the greatest sensitivity for the system. Said image 47 of the interface line is shown in FIG. 5 as passing through the trace point of axis 15 on the receiving surface since axis 15 intersects interface line 25 (FIG. 3).

Assuming that the optical system 13 includes image erecting means, the portion of the receiving surface located below line 47 is associated with the liquid silicon in the target area. This portion, represented with hatched lines in FIG. 5, is considerably less illuminated than the portion above line 47, for liquid silicon is far less luminous than solid silicon near its melting point.

As the level of the molten silicon rises or falls, the interface line image moves up or down in relation to line 47. Each photocell 37, 38 supplies a current proportional to the total flux it receives, said current being converted by the output-coupled converter into a voltage signal A, B. The receiving surface of photocell assembly 35 consists of two fields: a first field receiving the light from the liquid silicon and a second field lighted by the solid silicon at a power P, the contrast between the lighting of these two said fields being on the order of 1:20. It can thus be stated that the current supplied by each cell in response to the first field is negligible compared with the current corresponding to the second field. Every signal A or B is thus substantially proportional to P and to the area of the cell's second field. It is thus apparent that the output signal from the processing system 36, which is equal to $$\frac{A-B}{A+B},$$

indicates the level of the interface line and, pursuant, of the silicon melt, since the value of h is constant. The servo system 17 compares the electrical signal supplied by the processing system 36 with a reference signal to yield an error signal and controls the rate of feed of silicon pellets to reduce this error signal. The device shown in FIG. 3 thus makes it possible to stabilize the level of the melt at a preset level.

The thickness of the coat of polycristalline silicon deposited onto the carbon film 5 varies with the temperature of the melt, by a few micrometers per degree C, approximately. Moreover, the temperature of the melt changes as a function of the level of the melt, by approximately 3 degrees C per millimeter. The device according to the invention just described enables melt-level-induced melt temperature variations to be avoided. Thus, by varying the temperature of the melt through control of the heat supplied by the furnace 2, it is possible to adjust the thickness of the silicon layer being deposited onto the carbon film.

Thickness control can be adjusted by means of the measuring apparatus 18, which may be of any suitable type, such as an X-ray or gamma ray probe, a capacitative probe, or a differential system of mechanical sensors, supplying an electric measuring signal representing the thickness of the deposited layer of silicon. The second servo system 19 compares this signal to a reference signal and controls, via circuit 20, the power provided by furnace 2 in order to lessen the difference between the measuring or process signal and the reference or set point signal. Said servo system 19 can include means for changing the reference signal in view of effecting a corresponding change in deposited layer thickness.

The electrical signal output from processing system 36 is independent of the power P of light radiated by the silicon, and is thus also independent of changes in said power P over time. It has been shown in fact that said power P can change over time due to temperature variations of the silicon, homogeneity variations of the silicon, or variations of the light emitting lobe of the silicon caused by deformation of the carbon film. The device according to the invention thus enables control of the level of the silicon melt without interference from changes in the luminous power P.

Such a device could be readily applied to the large scale manufacture of solar cells.

We claim:

1. A device for process-type deposition of a coat of polycrystalline silicon or carbon film, said device comprising a crucible, an electrical system for feeding silicon to said crucible, crucible heating means enabling the formation of a silicon melt in said crucible, and means for upwardly transporting at a constant speed the carbon film passing vertically through the equilibrium surface of the melt in order to deposit said silicon coat, said device further comprising:

an optical system centered on an axis fixed in relation to said crucible, with said optical system fixed axis set to form a hot silicon radiation image of one specific target area of the silicon surface extending from just above to just below the interface line between the liquid silicon and the solid silicon deposited onto said carbon film, a photodetector arranged to receive said image and operable to responsively deliver an electric measuring signal representative of the liquid level in said crucible, and a servo system connected to the electrical output of said photodetector and operable to compare the measuring signal with reference signal representative of a preset level of the melt to yield an error signal, and said servo system being connected to the electrical drive for the crucible's silicon feed system so as to control crucible feed to reduce said error signal.

2. Device as claimed in claim 1, further comprising:
an apparatus for measuring the thickness of the silicon coat deposited onto the carbon film, and a second servo system connected to the measuring apparatus, operable to determine the difference between the measured thickness and a preset reference thickness, said second servo being connected to said crucible heatng means to adjust heating so as to reduce said thickness difference.

3. Device as in claim 1, wherein said optical system includes a diaphragm to define said target area on the silicon surface.

4. Device as claimed in claim 1, wherein the photodetector comprises:

two photocells with photosensitive surfaces thereof being coplanar and juxtaposed opposite one another across a dividing line, said detector being arranged so that said dividing line intersects said imaged interface line at other than a 90° angle, and a processing system connected to the output of the photocells, said processing system consisting of means for summing and subtracting the output signals from the two said cells and means for dividing the difference signal by the sum signal so obtained, said latter means being able to deliver said electric measuring signal, said measuring signal being unaffected by the time-dependent changes in the luminous power emitted by said traget interface area.

5. Device as claimed in claim 4, wherein said processing system comprises two current-to-voltage converters respectively connected to the outputs of said two photocells, said means for summing and substracting comprising a summing circuit and a subtracting circuit, each of said latter two circuits having two inputs connected to the outputs of said two converters, and said means for dividing comprising a dividing circuit having two inputs respectively connected to the output of said summing circuit and the output of said subtracting circuit.

6. Device as in claim 4, wherein said imaged interface line and said photocell dividing line intersect at a 45° angle on said photosensitive surface.

7. Device as in claim 4, wherein said photosensitive surfaces of said two photoelectric cells consist of the photosensitive surface of a solar cell, divided into two portions by a channel provided at the location of said dividing line.

* * * * *